(12) United States Patent
Sonawane et al.

(10) Patent No.: US 9,377,510 B2
(45) Date of Patent: Jun. 28, 2016

(54) SYSTEM FOR REDUCING PEAK POWER DURING SCAN SHIFT AT THE GLOBAL LEVEL FOR SCAN BASED TESTS

(71) Applicant: NVIDIA Corporation, Santa Clara, CA (US)

(72) Inventors: Milind Sonawane, San Jose, CA (US); Satya Puvvada, San Jose, CA (US); Amit Sanghani, San Jose, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 303 days.

(21) Appl. No.: 13/730,628

(22) Filed: Dec. 28, 2012

(65) Prior Publication Data

US 2014/0189455 A1     Jul. 3, 2014

(51) Int. Cl.
*G01R 31/28*     (2006.01)
*G06F 11/00*     (2006.01)
*G06F 1/12*     (2006.01)
*G01R 31/3185*     (2006.01)

(52) U.S. Cl.
CPC ... *G01R 31/318552* (2013.01); *G01R 31/318575* (2013.01)

(58) Field of Classification Search
CPC ............... G01R 31/318552; G01R 31/318575
USPC ......... 714/724, 726, 731, 733–734, 738, 742, 714/811, 814, 815, 34, 55; 713/400, 401, 713/500, 501
See application file for complete search history.

(56) References Cited

U.S. PATENT DOCUMENTS

| | | | |
|---|---|---|---|
| 3,577,086 A | 5/1971 | Kliman | |
| 5,453,993 A | 9/1995 | Kitaguchi | |
| 5,805,611 A | 9/1998 | McClure | |
| 5,881,271 A * | 3/1999 | Williams | 713/401 |
| 6,489,819 B1 | 12/2002 | Kono | |
| 6,653,957 B1 | 11/2003 | Patterson | |
| 6,817,006 B1 | 11/2004 | Wells | |
| 6,874,107 B2 | 3/2005 | Lesea | |
| 6,877,123 B2 * | 4/2005 | Johnston et al. | 714/731 |
| 6,891,395 B2 | 5/2005 | Wells | |
| 6,904,375 B1 | 6/2005 | Sabih | |
| 7,100,066 B2 * | 8/2006 | Jeong | 713/500 |
| 7,210,082 B1 | 4/2007 | Abdel-Hafez | |
| 7,249,298 B2 | 7/2007 | Sim | |
| 7,275,195 B2 | 9/2007 | Martinez | |
| 7,305,598 B1 | 12/2007 | Sanghani | |
| 7,383,481 B2 * | 6/2008 | Warren et al. | 714/726 |
| 7,562,276 B1 | 7/2009 | Azimi | |

(Continued)

FOREIGN PATENT DOCUMENTS

TW     594023     6/2004
TW     200811455     3/2008

(Continued)

*Primary Examiner* — Christine Tu

(57) ABSTRACT

A method for reducing peak power during a scan shift cycle is presented. The method comprises multiplexing a test clock with a functional clock on a integrated circuit at the root of a clock tree. The method also comprises adding a plurality of delay elements on a clock path, wherein the clock path is a signal resulting from the multiplexing. Further, the method comprises routing the clock path to a plurality of cores and a cache, e.g., an L2C cache, on the integrated circuit. Finally the method comprises staggering the test clock received by each of the plurality of cores and the cache by employing the delay elements during a scan shift cycle.

16 Claims, 15 Drawing Sheets

(56) References Cited

U.S. PATENT DOCUMENTS

| | | |
|---|---|---|
| 7,624,322 B2 | 11/2009 | Duggal |
| 7,657,807 B1 | 2/2010 | Watkins |
| 7,739,568 B1 | 6/2010 | Bertanzetti |
| 7,788,588 B2 | 8/2010 | McKee |
| 7,849,348 B1 * | 12/2010 | Sidiropoulos et al. ........ 713/500 |
| 7,925,465 B2 | 4/2011 | Lin et al. |
| 7,937,634 B2 | 5/2011 | Almukhaizim |
| 7,949,916 B1 | 5/2011 | Ang |
| 8,205,125 B2 | 6/2012 | Hales |
| 8,214,704 B1 | 7/2012 | Bertanzetti |
| 8,301,947 B1 | 10/2012 | Makar |
| 8,407,544 B2 | 3/2013 | Majumdar |
| 8,432,768 B2 | 4/2013 | Ware |
| 8,438,437 B2 | 5/2013 | Jain |
| 8,458,543 B2 | 6/2013 | Tung |
| 8,464,117 B2 | 6/2013 | Rakheja |
| 8,483,437 B2 | 7/2013 | Shamaie |
| 8,522,096 B2 | 8/2013 | Wang |
| 8,522,190 B1 * | 8/2013 | Sanghani et al. ............ 716/136 |
| 8,543,873 B2 | 9/2013 | Sul |
| 8,650,524 B1 | 2/2014 | Chakravadhanula |
| 8,726,112 B2 | 5/2014 | Rajski |
| 8,904,256 B1 | 12/2014 | Chakravadhanula |
| 9,222,981 B2 | 12/2015 | Puvvada et al. |
| 2002/0184560 A1 | 12/2002 | Wang |
| 2008/0195346 A1 | 8/2008 | Lin et al. |
| 2010/0313089 A1 | 12/2010 | Rajski |
| 2011/0166818 A1 | 7/2011 | Lin et al. |
| 2011/0296265 A1 | 12/2011 | Rakheja |
| 2012/0110402 A1 | 5/2012 | Wang |
| 2012/0331362 A1 | 12/2012 | Tekumalla |
| 2013/0271197 A1 * | 10/2013 | Sanghani et al. ............. 327/225 |
| 2013/0318414 A1 | 11/2013 | Sinanoglu |
| 2014/0129885 A1 | 5/2014 | Chen |

FOREIGN PATENT DOCUMENTS

| | | |
|---|---|---|
| TW | 201239377 | 10/2012 |
| WO | 2011059439 | 5/2011 |

* cited by examiner

SYSTEM FOR REDUCING PEAK POWER DURING SCAN SHIFT AT THE GLOBAL LEVEL FOR SCAN BASED TESTS

CROSS-REFERENCE TO RELATED APPLICATIONS

Related Applications

The present application is a continuation-in-part of U.S. patent application Ser. No. 13/730,551, filed Dec. 28, 2012 entitled "SYSTEM FOR REDUCING PEAK POWER DURING SCAN SHIFT AT THE LOCAL LEVEL FOR SCAN BASED TESTS," naming Milind Sonawane, Satya Puvvada and Amit Sanghani as inventors. That application is incorporated herein by reference in its entirety and for all purposes.

FIELD OF THE INVENTION

Embodiments according to the present invention generally relate to testing integrated circuits and more specifically to performing scan based tests on integrated circuits.

BACKGROUND OF THE INVENTION

An integrated circuit or circuit assembly generally contains one or more clocks, either generated internally or controlled externally. Each clock is distributed to a set of storage cells via a skew-minimized network, which delivers a clock pulse to all the storage cells at virtually the same time. Such a clock, its related storage cells and all combinational logic blocks bounded by the storage cells, form a clock domain.

Scan testing of circuits is well known and is the most widely used design-for-test (DFT) technique used to test integrated circuits. It replaces all or part of original storage cells with scan cells that may be linked to form one or more scan chains. A scan-based integrated circuit or circuit assembly can be tested by repeating a shift cycle followed by a capture cycle. In a shift cycle, pseudorandom or predetermined test stimuli are shifted into all scan chains, making their outputs as controllable as primary inputs. In a capture cycle, test responses are latched into some or all scan chains, making their inputs as observable as primary outputs, because the values captured into scan chains can be shifted out in the next shift cycle.

Scan based tests are expensive because of the high capital investment in test equipment and because they can require a considerable amount of time to run. Test times for scan based tests depend on how fast the test is being run and the volume of the test, e.g., the magnitude of the test pattern. Due to high demands to reduce test costs of scan based tests and optimize turn-around time for integrated circuit releases, scan shift operations need to be run at increasingly higher clock speeds. Usually scan shift operation test times are 50% to 75% of the total test time required for the chip.

Running scan shift operations at higher clock speeds helps in reducing the overall test time. However, it can cause power issues resulting in flip-flops and gates behaving incorrectly under inadequate power supply conditions. This could cause false failures due to the electrical and thermal stressing of the silicon under test, which could result in significant yield loss. Accordingly, users of the test system are left with no other alternative but to slow down the clock speeds in order to minimize power related issues, which results in longer test times.

For example, during a shift cycle all the test stimuli are shifted into the flip-flops simultaneously, thereby, causing all the flip-flops on the chip to switch at the same time. This causes a substantially high peak current resulting in a voltage drop from the power rails due to rail resistance. Because of the voltage drop resulting from the peak current demand, the voltage supplied to the chip is not within the expected operating range of the chip, which may cause it to malfunction. Also, the flip-flops on the chip will eventually start failing if the scan shift operations continue to be run at these high operating frequencies. As compared to scan shift mode, running the chip at higher frequencies during normal functioning mode is not problematic because not all the flip flops are expected to switch at the same time during normal functional mode.

Further, the dynamic power consumption during scan test, with and without test compression, is always higher than the functional mode because of very high toggling rates and logic activity during scan shift operations. Exceeding the peak power for which the chip and package have been designed can result in excessive heat dissipation during testing that can damage the package. This increased dynamic power consumption can cause reliability issues in chips, which may result in the chip subsequently failing in the field.

BRIEF SUMMARY OF THE INVENTION

Accordingly, a need exists for a system that allows scan shift operations to run fast at high clock speeds while reducing peak power issues caused by the high toggling rate and logic activity during scan shift mode during DFT. It is also necessary to make the scan test mode power-aware to avoid stressing the power distribution network in test mode during production testing. Embodiments of the present invention provide a method and system for reducing peak power problems during scan shift mode at the global level.

According to one embodiment of the present invention, peak power at the global level is reduced during the scan shift cycle by staggering the test clock to the CPU Cores and the cache, e.g., an L2C cache, thereby, reducing the global voltage drop from the power rails. This allows the scan shift operations to be run at higher clock speeds, which in turn eventually reduces the overall test time during a production test.

In one embodiment, a method for testing an integrated circuit is presented. The method comprises multiplexing a test clock with a functional clock on said integrated circuit at a root of a clock tree. The method also comprises passing a clock path signal through a plurality of delay elements, wherein the clock path signal is a signal resulting from the multiplexing. Further, the method comprises routing the clock path signal to a plurality of cores and a cache on the integrated circuit. Finally the method comprises staggering the clock path signal received by each of the plurality of cores and the cache by employing the delay elements during a scan shift cycle.

In one embodiment, a method for testing an integrated circuit is presented. The method comprises multiplexing a test clock with a functional clock on said integrated circuit at a root of a clock tree. The method also comprises passing a clock path signal through a plurality of delay elements, wherein the clock path signal is a signal resulting from the multiplexing. Further, the method comprises routing the clock path signal to a plurality of cores and a cache on the integrated circuit. Finally the method comprises staggering the clock path signal received by each of the plurality of cores and the cache by employing the delay elements during a scan shift cycle wherein each of the plurality of cores and the cache receives an active edge of the clock path signal at a separate time.

Finally, in one embodiment, a system for reducing peak power during a scan shift cycle is disclosed. The system comprises a computer system comprising a tester processor, wherein said tester processor is communicatively coupled to a integrated circuit. The integrated circuit comprises a plurality of I/O ports, wherein at least one I/O port is associated with a test clock signal driven by the tester processor. The integrated circuit further comprises a multiplexer operable to multiplex the test clock signal with a functional clock signal at a root of a clock tree. Also, it comprises a plurality of cores and a cache. In addition, it comprises a clock trimmer module comprising a plurality of delay elements operable to add delay to a clock path, wherein the clock path is an output of the multiplexer and wherein the plurality of delay elements are operable to stagger a respective test clock received by each of the plurality of cores and the cache via the clock path.

The following detailed description together with the accompanying drawings will provide a better understanding of the nature and advantages of the present invention.

BRIEF DESCRIPTION OF THE DRAWINGS

Embodiments of the present invention are illustrated by way of example, and not by way of limitation, in the figures of the accompanying drawings and in which like reference numerals refer to similar elements.

DETAILED DESCRIPTION OF THE INVENTION

Figure 1:
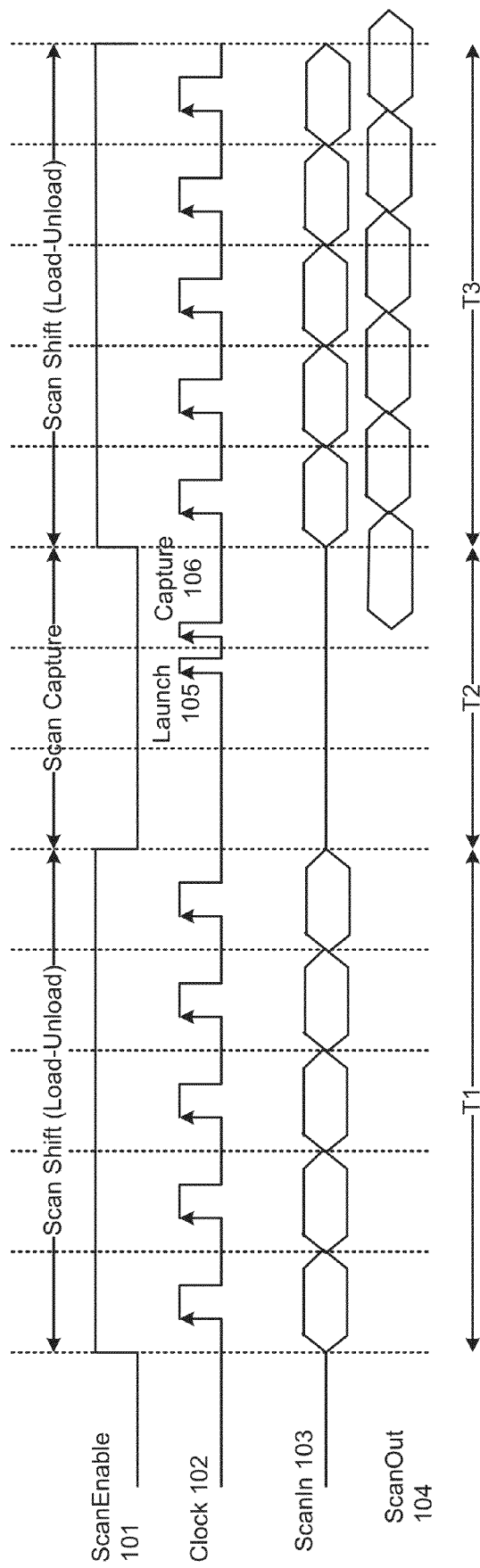
FIG. 1 is a timing diagram of an exemplary scan shift and scan capture cycle of a conventional scan based test.

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those utilizing physical manipulations of physical quantities. Usually, although not necessarily, these quantities take the form of electrical or magnetic signals capable of being stored, transferred, combined, compared, and otherwise manipulated in a computer system. It has proven convenient at times, principally for reasons of common usage, to refer to these signals as transactions, bits, values, elements, symbols, characters, samples, pixels, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "routing," "generating," "shifting," "serializing," "deserializing," "allocating," "associating," "moving," "accessing," "erasing," "determining," "identifying," "caching," "maintaining," "incrementing," or the like, refer to actions and processes (e.g., flowchart 1500 of FIG. 15) of a computer system or similar electronic computing device or processor (e.g., system 110 of FIG. 4A). The computer system or similar electronic computing device manipulates and transforms data represented as physical (electronic) quantities within the computer system memories, registers or other such information storage, transmission or display devices.

Embodiments described herein may be discussed in the general context of computer-executable instructions residing on some form of computer-readable storage medium, such as program modules, executed by one or more computers or other devices. By way of example, and not limitation, computer-readable storage media may comprise non-transitory computer-readable storage media and communication media; non-transitory computer-readable media include all computer-readable media except for a transitory, propagating signal. Generally, program modules include routines, programs, objects, components, data structures, etc., that perform particular tasks or implement particular abstract data types. The functionality of the program modules may be combined or distributed as desired in various embodiments.

Computer storage media includes volatile and nonvolatile, removable and non-removable media implemented in any method or technology for storage of information such as computer-readable instructions, data structures, program modules or other data. Computer storage media includes, but is not limited to, random access memory (RAM), read only memory (ROM), electrically erasable programmable ROM (EEPROM), flash memory or other memory technology, compact disk ROM (CD-ROM), digital versatile disks (DVDs) or other optical storage, magnetic cassettes, magnetic tape, magnetic disk storage or other magnetic storage devices, or any other medium that can be used to store the desired information and that can be accessed to retrieve that information.

Communication media can embody computer-executable instructions, data structures, and program modules, and includes any information delivery media. By way of example, and not limitation, communication media includes wired media such as a wired network or direct-wired connection, and wireless media such as acoustic, radio frequency (RF), infrared, and other wireless media. Combinations of any of the above can also be included within the scope of computer-readable media.

Figure 4A:
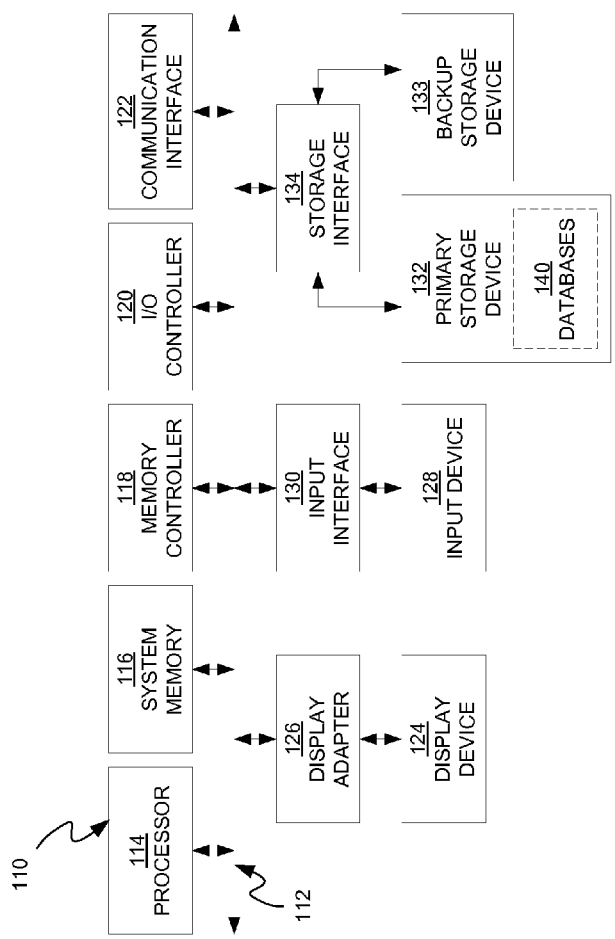
FIG. 4A is a block diagram of an example of a computing system capable of implementing embodiments of the present invention.

FIG. 4A is a block diagram of an example of a tester computing system 110 capable of implementing embodiments of the present disclosure. Computing system 110 broadly represents any single or multi-processor computing device or system capable of executing computer-readable instructions. Examples of computing system 110 include, without limitation, workstations, laptops, client-side terminals, servers, distributed computing systems, handheld devices, or any other computing system or device. In its most basic configuration, computing system 110 may include at least one processor 114 and a system memory 116.

Tester processor 114 generally represents any type or form of processing unit capable of processing data or interpreting and executing instructions. In certain embodiments, processor 114 may receive instructions from a software application or module. These instructions may cause processor 114 to perform the functions of one or more of the example embodiments described and/or illustrated herein.

System memory 116 generally represents any type or form of volatile or non-volatile storage device or medium capable of storing data and/or other computer-readable instructions. Examples of system memory 116 include, without limitation, RAM, ROM, flash memory, or any other suitable memory device. Although not required, in certain embodiments computing system 110 may include both a volatile memory unit (such as, for example, system memory 116) and a non-volatile storage device (such as, for example, primary storage device 132).

Computing system 110 may also include one or more components or elements in addition to processor 114 and system memory 116. For example, in the embodiment of FIG. 4A, computing system 110 includes a memory controller 118, an input/output (I/O) controller 120, and a communication interface 122, each of which may be interconnected via a communication infrastructure 112. Communication infrastructure 112 generally represents any type or form of infrastructure capable of facilitating communication between one or more components of a computing device. Examples of communication infrastructure 112 include, without limitation, a communication bus (such as an Industry Standard Architecture (ISA), Peripheral Component Interconnect (PCI), PCI Express (PCIe), or similar bus) and a network.

Memory controller 118 generally represents any type or form of device capable of handling memory or data or controlling communication between one or more components of computing system 110. For example, memory controller 118 may control communication between processor 114, system memory 116, and I/O controller 120 via communication infrastructure 112.

I/O controller 120 generally represents any type or form of module capable of coordinating and/or controlling the input and output functions of a computing device. For example, I/O controller 120 may control or facilitate transfer of data between one or more elements of computing system 110, such as processor 114, system memory 116, communication interface 122, display adapter 126, input interface 130, and storage interface 134.

Communication interface 122 broadly represents any type or form of communication device or adapter capable of facilitating communication between example computing system 110 and one or more additional devices. For example, communication interface 122 may facilitate communication between computing system 110 and a private or public network including additional computing systems. Examples of communication interface 122 include, without limitation, a wired network interface (such as a network interface card), a wireless network interface (such as a wireless network interface card), a modem, and any other suitable interface. In one embodiment, communication interface 122 provides a direct connection to a remote server via a direct link to a network, such as the Internet. Communication interface 122 may also indirectly provide such a connection through any other suitable connection.

Communication interface 122 may also represent a host adapter configured to facilitate communication between computing system 110 and one or more additional network or storage devices via an external bus or communications channel. Examples of host adapters include, without limitation, Small Computer System Interface (SCSI) host adapters, Universal Serial Bus (USB) host adapters, IEEE (Institute of Electrical and Electronics Engineers) 1394 host adapters, Serial Advanced Technology Attachment (SATA) and External SATA (eSATA) host adapters, Advanced Technology Attachment (ATA) and Parallel ATA (PATA) host adapters, Fibre Channel interface adapters, Ethernet adapters, or the like. Communication interface 122 may also allow computing system 110 to engage in distributed or remote computing. For example, communication interface 122 may receive instructions from a remote device or send instructions to a remote device for execution.

As illustrated in FIG. 4A, computing system 110 may also include at least one display device 124 coupled to communication infrastructure 112 via a display adapter 126. Display device 124 generally represents any type or form of device capable of visually displaying information forwarded by display adapter 126. Similarly, display adapter 126 generally represents any type or form of device configured to forward graphics, text, and other data for display on display device 124.

As illustrated in FIG. 4A, computing system 110 may also include at least one input device 128 coupled to communication infrastructure 112 via an input interface 130. Input device 128 generally represents any type or form of input device capable of providing input, either computer- or human-generated, to computing system 110. Examples of input device 128 include, without limitation, a keyboard, a pointing device, a speech recognition device, or any other input device.

As illustrated in FIG. 4A, computing system 110 may also include a primary storage device 132 and a backup storage device 133 coupled to communication infrastructure 112 via a storage interface 134. Storage devices 132 and 133 generally represent any type or form of storage device or medium capable of storing data and/or other computer-readable instructions. For example, storage devices 132 and 133 may be a magnetic disk drive (e.g., a so-called hard drive), a floppy disk drive, a magnetic tape drive, an optical disk drive, a flash drive, or the like. Storage interface 134 generally represents any type or form of interface or device for transferring data between storage devices 132 and 133 and other components of computing system 110.

In one example, databases 140 may be stored in primary storage device 132. Databases 140 may represent portions of a single database or computing device or it may represent multiple databases or computing devices. For example, databases 140 may represent (be stored on) a portion of computing system 110 and/or portions of example network architecture 200 in FIG. 2 (below). Alternatively, databases 140 may represent (be stored on) one or more physically separate devices capable of being accessed by a computing device, such as computing system 110 and/or portions of network architecture 200.

Continuing with reference to FIG. 4A, storage devices 132 and 133 may be configured to read from and/or write to a removable storage unit configured to store computer software, data, or other computer-readable information. Examples of suitable removable storage units include, without limitation, a floppy disk, a magnetic tape, an optical disk, a flash memory device, or the like. Storage devices 132 and 133 may also include other similar structures or devices for allowing computer software, data, or other computer-readable instructions to be loaded into computing system 110. For example, storage devices 132 and 133 may be configured to read and write software, data, or other computer-readable information. Storage devices 132 and 133 may also be a part of computing system 110 or may be separate devices accessed through other interface systems.

Many other devices or subsystems may be connected to computing system 110. Conversely, all of the components and devices illustrated in FIG. 4A need not be present to practice the embodiments described herein. The devices and subsystems referenced above may also be interconnected in different ways from that shown in FIG. 4A. Computing system 110 may also employ any number of software, firmware, and/or hardware configurations. For example, the example embodiments disclosed herein may be encoded as a computer program (also referred to as computer software, software applications, computer-readable instructions, or computer control logic) on a computer-readable medium.

The computer-readable medium containing the computer program may be loaded into computing system 110. All or a portion of the computer program stored on the computer-readable medium may then be stored in system memory 116 and/or various portions of storage devices 132 and 133. When executed by processor 114, a computer program loaded into computing system 110 may cause processor 114 to perform and/or be a means for performing the functions of the example embodiments described and/or illustrated herein. Additionally or alternatively, the example embodiments described and/or illustrated herein may be implemented in firmware and/or hardware.

For example, a computer program for running scan based tests in accordance with embodiments of the present invention may be stored on the computer-readable medium and then stored in system memory 116 and/or various portions of storage devices 132 and 133. When executed by the processor 114, the computer program may cause the processor 114 to perform and/or be a means for performing the functions required for carrying out the scan based test processes of the present invention.

Figure 4B:
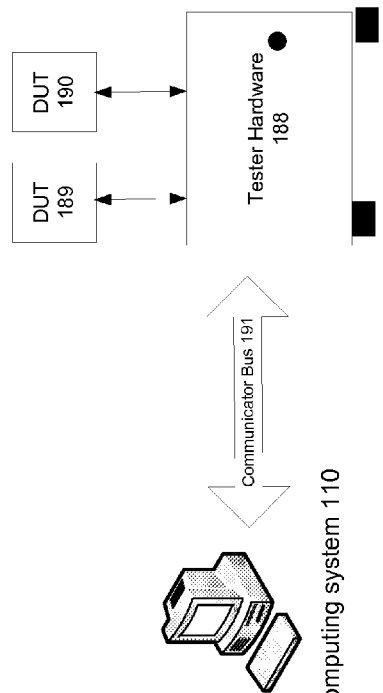
FIG. 4B is a schematic block diagram for an automated test equipment apparatus on which embodiments of the present invention can be implemented in accordance with one embodiment of the present invention.

FIG. 4B is a schematic block diagram for an automated test equipment (ATE) apparatus on which embodiments of the present scan-based test system can be implemented in accordance with one embodiment of the present invention. In one embodiment, the tester computing system 110 performs the same function as the computing system discussed in reference to FIG. 4A and comprises one or more linked computers. In other embodiments, the system controller often comprises only a single computer. The tester computing system 110 is the overall system control unit, comprising tester processor 114, that runs the software for the ATE responsible for conducting the tests on the connected devices under test, e.g., integrated circuits being scan tested.

The communicator bus 191 provides a high-speed electronic communication channel between the tester computing system and the tester hardware. The communicator bus can also be referred to as a backplane, a module connection enabler, or system bus. Physically, communicator bus 191 is a fast, high-bandwidth duplex connection bus that can be electrical, optical, etc.

Tester hardware 188 comprises the complex set of electronic and electrical parts and connectors necessary to provide the test stimulus to the devices under test (DUTs) 189 and 190 and measure the response of the DUTs to the stimulus, and compare it against the expected response. In the present invention, the DUTs can be a plurality of integrated circuits being scan tested.

System for Reducing Peak Power During Scan Shift at the Local Level for Scan Based Tests Embodiments of the present invention provide a method and system for reducing peak power problems during scan shift mode at the local level. According to one embodiment of the present invention, partition level shift clock staggering is used to reduce higher than acceptable peak power magnitudes at the local level during scan shift mode, thereby, allowing the scan shift operations to be run at higher clock speeds. Running the scan shift operations at higher clock speeds eventually reduces the overall test time during a production test.

FIG. 1 is a timing diagram of an exemplary scan shift and scan capture cycle of a conventional scan-based test. The scan-based technique is a cost-effective solution to test the operation of integrated circuits, which include functional logic elements and register elements, such as flip-flop circuits or latches, with functional interconnections between the different elements. The integrated circuit design includes specific provisions for re-configuring the interconnections of the elements of the integrated circuit so that test data signals entered serially at one or more input pins can be shifted ('scanned') along a scan chain different from the normal functional system path from one register element to another in order to place the signals of the test vector at the desired positions. This takes place during time period T1 in FIG. 1, which is the scan-shift cycle. The ScanEnable signal 101 is enabled and set high during this time while the inputs represented by the ScanIn signal vector 103 are scanned in by pulsing the Clock signal 102.

The integrated circuit then returns temporarily to its normal functional system configuration for one or more clock pulses to produce test outputs corresponding to a particular logic function outcome from the normal logic functions in the integrated circuit, given the values of the test vector. These outputs are captured during the Scan Capture cycle, T2. Two pulses, Launch 105 and Capture 106, are pulsed to produce the test outputs of the particular logic function at the output of the flip-flops and latches in the integrated circuit.

The integrated circuit then reverts to the scan shift configuration during T3 and shifts out the test outputs, as represented by signal vector ScanOut 104 in FIG. 1, along the scan chain to one or more output pins where they can be retrieved and compared with the expected results to diagnose faults.

Running scan shift operations at higher clock speeds helps in reducing the overall test time. However, as discussed above, it can cause power issues as a result of all the flip-flops and latches in the integrated circuit switching at the same time. For scan based tests, test power is mainly divided in scan chain shift power and scan capture power. During scan shift mode, shift clocks are applied to load scan data and unload scan data through scan chains. Average shift power will dominate heat dissipation during scan shift due to high toggling rates and logic activity as compared to functional mode. Also excessive peak power can cause scan chain failures due to voltage drop with respect to the power rails, and result in yield loss as mentioned earlier.

Figure 2:
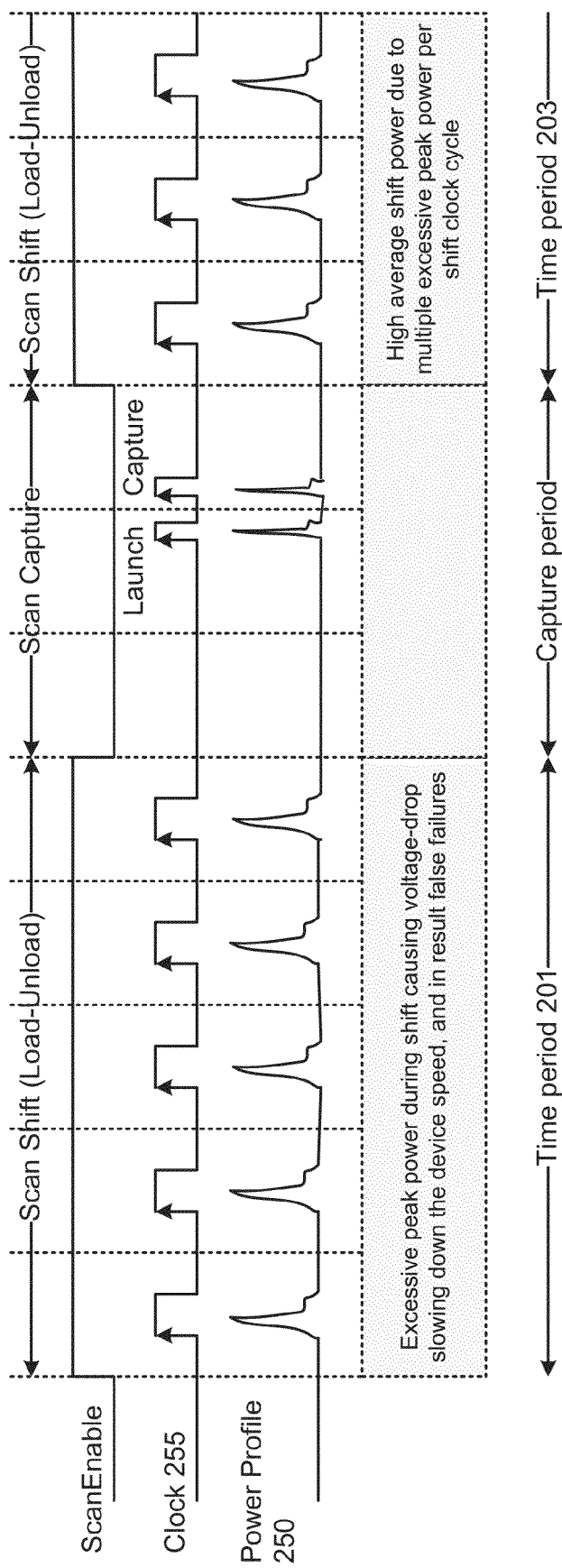
FIG. 2 is a timing diagram of the power activity during an exemplary scan shift and scan capture cycle of a conventional scan based test.

FIG. 2 is a timing diagram of the power activity during an exemplary scan shift and scan capture cycle of a conventional scan based test. Peak power during scan shift depends on the number of flip-flops clocked at the same time on the active edge of the scan clock 255. As seen from the representation of the power profile, 250, in FIG. 2, the toggling of all the flip-flops together during the scan shift cycles in time period 201 and 203 results in excessive peak power conditions. This results in a higher than desirable voltage drop from the power rails, which slows down the device speed and can cause false failures. Also it results in a high average shift power due to multiple excessive power spikes per shift clock cycle. Reducing the number of flip-flops toggled per active edge of the shift clock 255 can effectively reduce the peak power.

Certain solutions exist in the prior art for dealing with power issues during shift cycles illustrated in FIG. 2 by using Design For Test (DFT) techniques as well as Automatic Test Pattern Generation (ATPG). Various DFT techniques used include using special flops to disable flop output during scan shift, re-ordering of scan chains, scan chain segmentation, and selective scan chain disabling. Adjacent fill, 0-fill and 1-fill are other ATPG methods for reducing shift-in power.

Figure 3A:
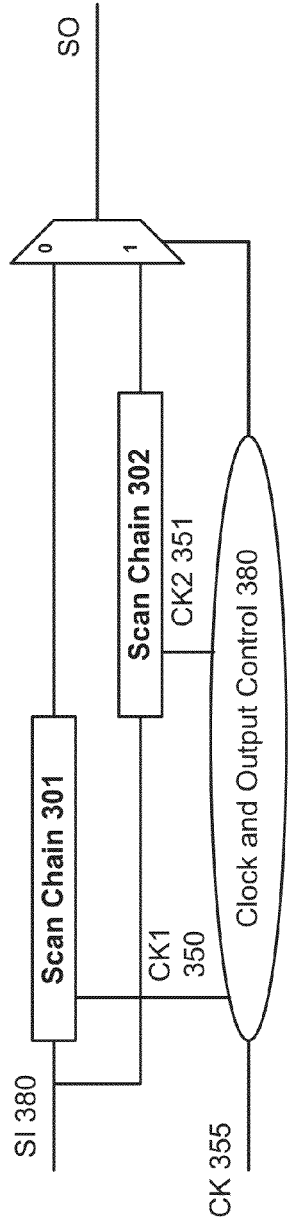
FIG. 3A is a schematic diagram of an exemplary prior art system for reducing peak power issues by implementing scan clock staggering.
Figure 3B:
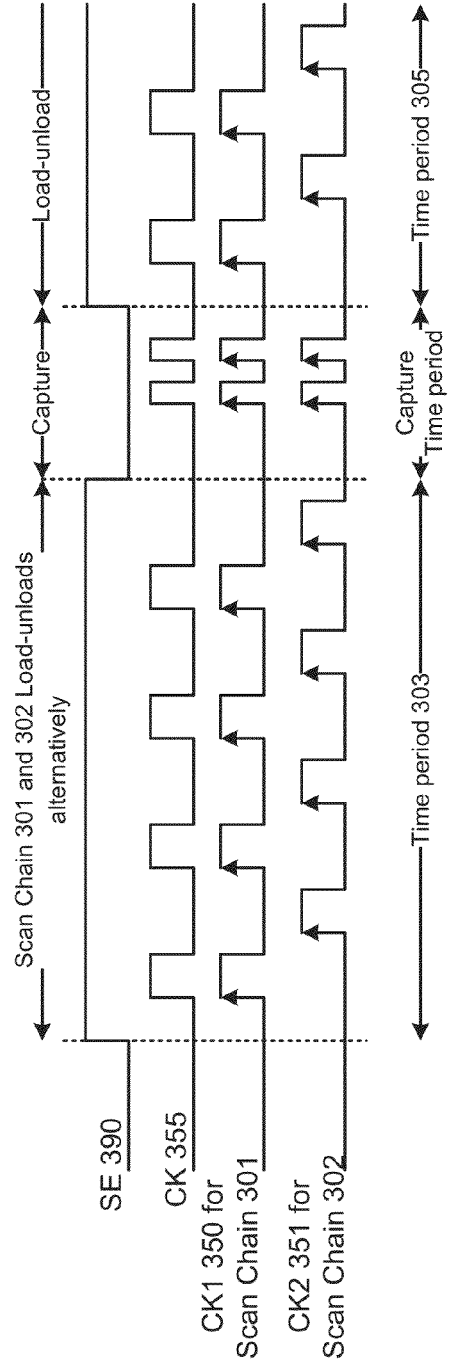
FIG. 3B is a timing diagram for the exemplary prior art system in FIG. 3A.

FIG. 3A is a schematic diagram of an exemplary prior art system for reducing peak power issues by implementing scan clock staggering. FIG. 3B is a timing diagram for the exemplary prior art system in FIG. 3B that implements scan clock staggering. Scan clock staggering involves offsetting the clocks to the different scan chains in an integrated circuit, so that the scan chains can be pulsed at different times. By offsetting the clock to each scan chain, clock staggering reduces the number of flip-flops that toggle together at any given time. For example, in the circuit in FIG. 3A, Clock and Output Control module 380 uses clock signal, CK 355, to generate two clocks signals, CK1 350 and CK2 351, where CK2 351 is a slightly delayed version of CK 355. CK1 350, however, is the same as original clock signal CK 355. CK1 350 acts as the scan test clock for Scan Chain 301 while CK2 351 acts as the scan test clock for Scan Chain 302.

Scan input, SI 380, therefore, gets loaded into Scan Chain 301 when CK1 350 pulses and Scan Chain 302 gets loaded into Scan Chain 302 when CK2 351 pulses. Also, as seen in FIG. 3B, Scan Chain 301 and 302, get loaded and unloaded alternatively during Time period 303 and Time period 305 while ScanEnable 390 is active. Therefore, by loading and unloading the latches and flip-flops in the two scan chains at separate times, peak power issues are mitigated.

The present invention is also concerned with mitigating peak power issues at the local level during scan shift by implementing a partition level shift clock staggering scheme. The present invention is directed to increasing scan shift speed by reducing scan shift peak power during scan based logic testing of high speed, high density integrated circuits e.g., graphics chips with integrated CPUs. In one embodiment, the present invention is a scan shift clock staggering technique that takes advantage of test compression in a SerDes scan architecture. SerDes (Serializer/Deserializer) is pair of functional blocks commonly used in high speed communications to compensate for limited input/outputs (I/Os). These blocks convert data between serial data and parallel interfaces in each direction. In a SerDes scan architecture multiple scan chains are driven from very few external scan I/O chip pins. Further, the number of I/Os required to apply scan data to these scan chains are reduced because of using the SerDes architecture.

Figure 5:
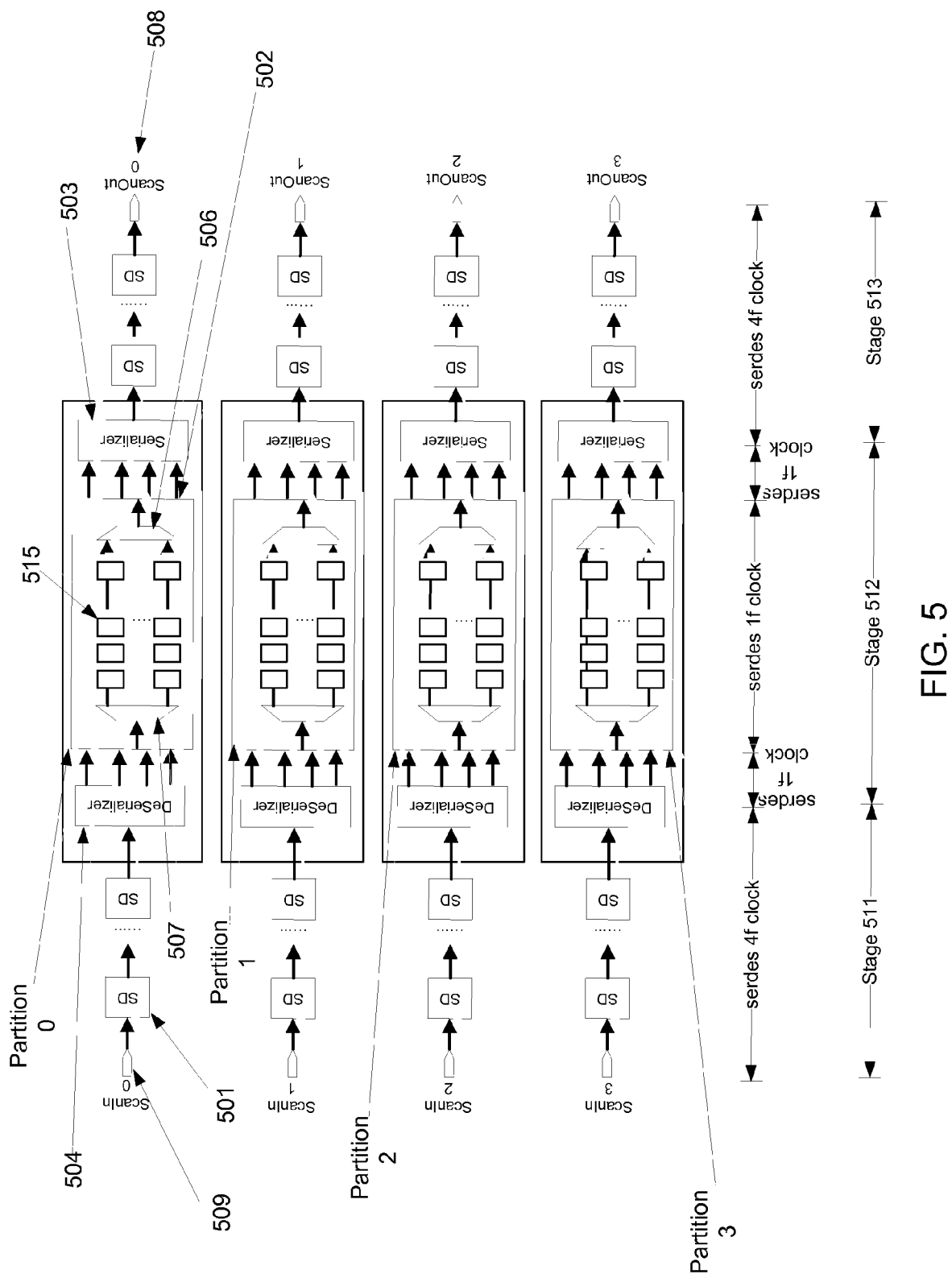
FIG. 5 is a block diagram of an example of a SerDes scan architecture with test compression capable of implementing embodiments of the present invention.

FIG. 5 is a block diagram of an example of a SerDes scan architecture with test compression capable of implementing embodiments of the present invention. With test compression, scan chains are grouped in partitions according to physical hierarchy. FIG. 5 illustrates four partitions of a integrated circuit, Partition 0-Partition 3. Each integrated circuit is divided into several different partitions, with each partition comprising its own scan chains. Each partition, e.g., partition 502, in FIG. 5 receives data from a deserializer module, 504, and outputs data to a serializer module, 503. The deserializer module, 504, receives the scan data from an I/O port ScanIn0 509 and deserializes the high speed serial data coming in during scan shift input mode through the scan data pipeline 501. The scan data is driven onto the I/O pins from the processor 114 of tester computing system 110 that may be connected to the integrated circuit under test.

In one embodiment, the SerDes modules can be 4 bits wide and the deserializer supports 1:4 and serializer supports 4:1 mode. In this embodiment, the deserializer module can take data coming in at up to four times the frequency at which the internal core scan chains within the partitions are operating. For example, the deserializer can receive incoming high speed serial data at 250 MHz and feed it to the internal scan chains within the partition at 62.5 MHz. In normal mode internal scan chains are running on test clocks which are $\frac{1}{4}^{th}$ of a SerDes "4f" clock. As seen in FIG. 5, stages 511 operates at a "4f" clock frequency while the internal scan chains, e.g., scan chain 515, operates at a "1f" clock frequency within stage 512. Thus, by deserializing the data, the deserializer module allows the internal scan chains within the partition to run at a slower frequency than the high speed serial data being delivered to the partition through scan data pipeline 501.

Similarly serializer module 503 converts data from the internal scan chains operating at a "1f" clock frequency within stage 512 to a "4f" clock frequency at stage 513 so that it can be reconverted back to high speed serial data for the scan shift out. The serializer module 503 outputs the data through the scan data pipeline to I/O port ScanOut0 508. In the example from above, serializer module 503 would convert the 62.5 MHz data back to 250 MHz high speed serialized output for the scan shift out cycle.

The partitions illustrated in FIG. 5 also implement compressor and decompressor logic for the internal core chains. Decompressor 507 decompresses and decodes the data received from deserializer 504 while compressor 506 compresses data to be sent to serializer 503.

In a conventional SerDes architecture, the same test clock would drive all the scan chains in all the partitions, which results in all the scan flops toggling together and increasing peak power on the active edge of the test clock as illustrated in FIG. 2. This causes voltage (or IR) drop with respect to the power rails, which could slow down the circuit resulting in false failures. Also the power rails within and around the partitions in FIG. 5 are not designed to withstand such a high level of power activity.

The present invention mitigates peak power issues in a SerDes scan architecture by skewing the scan shift clock to the scan chains within each partition by a certain amount. This will allow scan chains from one partition to toggle at a time, while scan chains from other partitions remain silent. Further, it will allow one partition to load scan data while efficiently sharing the power rails structure around that partition without causing significant IR drop. Finally, it will also allow shifting scan chains at higher frequencies to reduce test time without causing any false failures.

However, there are some practical difficulties in skewing the scan shift clock in each partition because adding delay logic ("clock trimmers") will also affect the functional timing of the circuit because the same functional clock is also being multiplexed onto the same line as the scan test clock. Also due to very high speed clocks being used for each partition, introducing delay logic on the clock path can increase the clock uncertainty requirement for timing closure.

Figure 6:
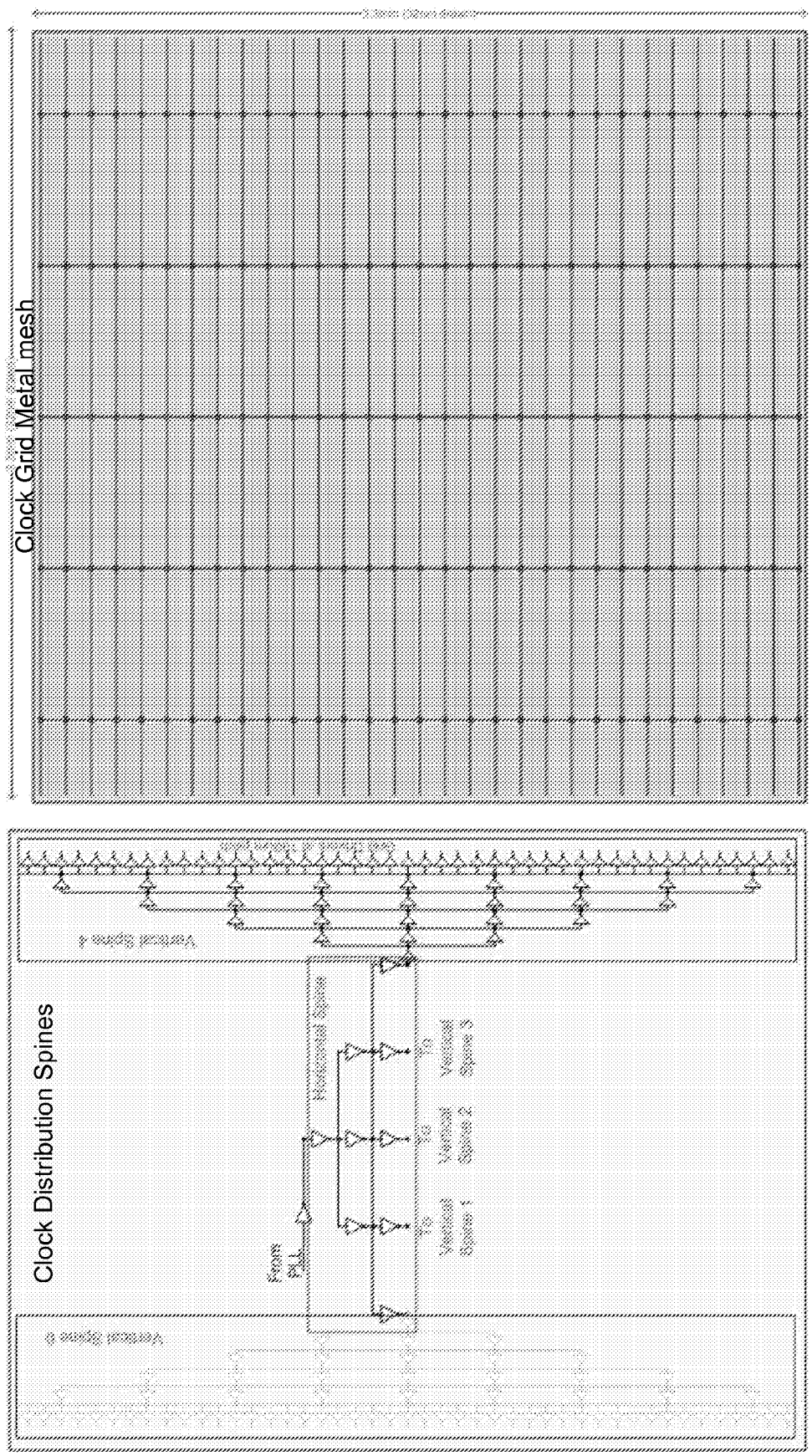
FIG. 6 is a schematic diagram illustrating an exemplary system for routing clocks as a mesh structure.

Another practical difficulty in skewing scan shift clocks using delay logic is that in very high speed CPU cores, the clocks are routed as a mesh structure and there is no conventional clock tree synthesis involved. For example, FIG. 6 is a schematic diagram illustrating an exemplary system for routing clocks as a mesh structure. Adding delay logic is, therefore, not possible in each partition.

Figure 7:
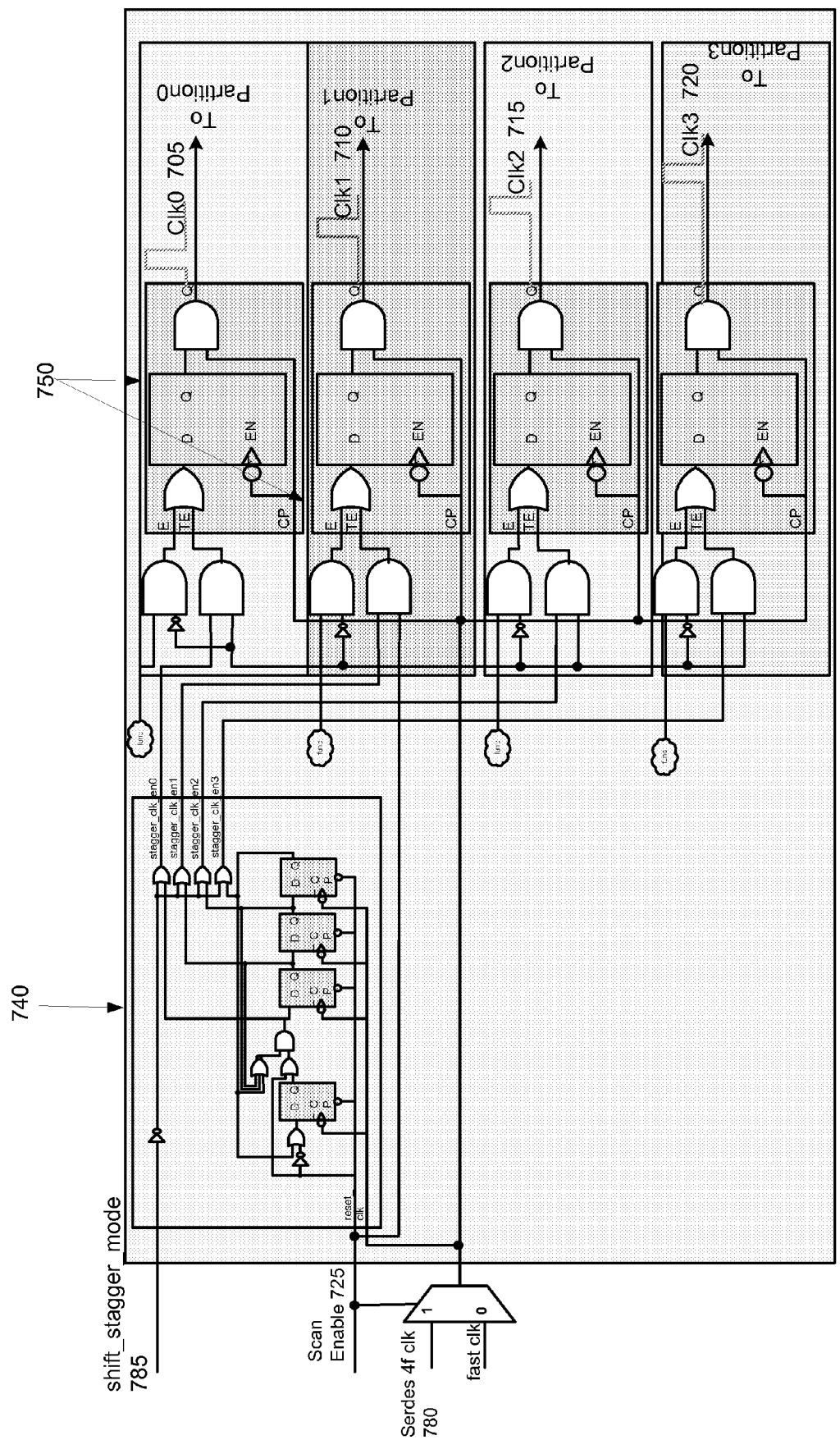
FIG. 7 is a high level schematic diagram illustrating an exemplary circuit for controlling partition level shift clock staggering using clock stagger control logic in accordance with one embodiment of the present invention.

In one embodiment, the present invention addresses these issues by controlling partition level shift clock staggering using clock stagger control logic. FIG. 7 is a high level schematic diagram illustrating an exemplary circuit for controlling partition level shift clock staggering using clock stagger control logic in accordance with one embodiment of the present invention. The exemplary circuit of FIG. 7 controls partition level shift clock staggering for the exemplary SerDes system with four partitions in FIG. 5 in accordance with an embodiment of the present invention.

Stagger control module 740 comprises the stagger control logic for generating clock stagger enables for each of the four partition scan clocks in accordance with one embodiment of the present invention. Modules 750 are the clock gating cells that work in conjunction with the stagger control logic module 740 to generate the staggered clock pulses, Clk0 705, Clk1 710, Clk2 715 and Clk3 720 for clocking the internal scan chains in each of the four partitions during scan shift mode. Clk0 705 gets routed to Partition0, Clk1 710 gets routed to Partition1, Clk2 715 gets routed to Partition2 and Clk3 720 gets routed to Partition3, wherein Partition0-Partition3 perform essentially the same function as they do in FIG. 5. Both the ScanEnable 725 and shift_stagger_mode 785 signals are enabled during scan shift mode.

In one embodiment, stagger control module 740 can be programmed using JTAG bits so the user can configure the sequence that the partitions will shift in. For example, if the user wants to prevent the flops in neighboring partitions from switching consecutively, the user can program the JTAG bits to separate out the shift cycles of the neighboring partitions.

Figure 8:
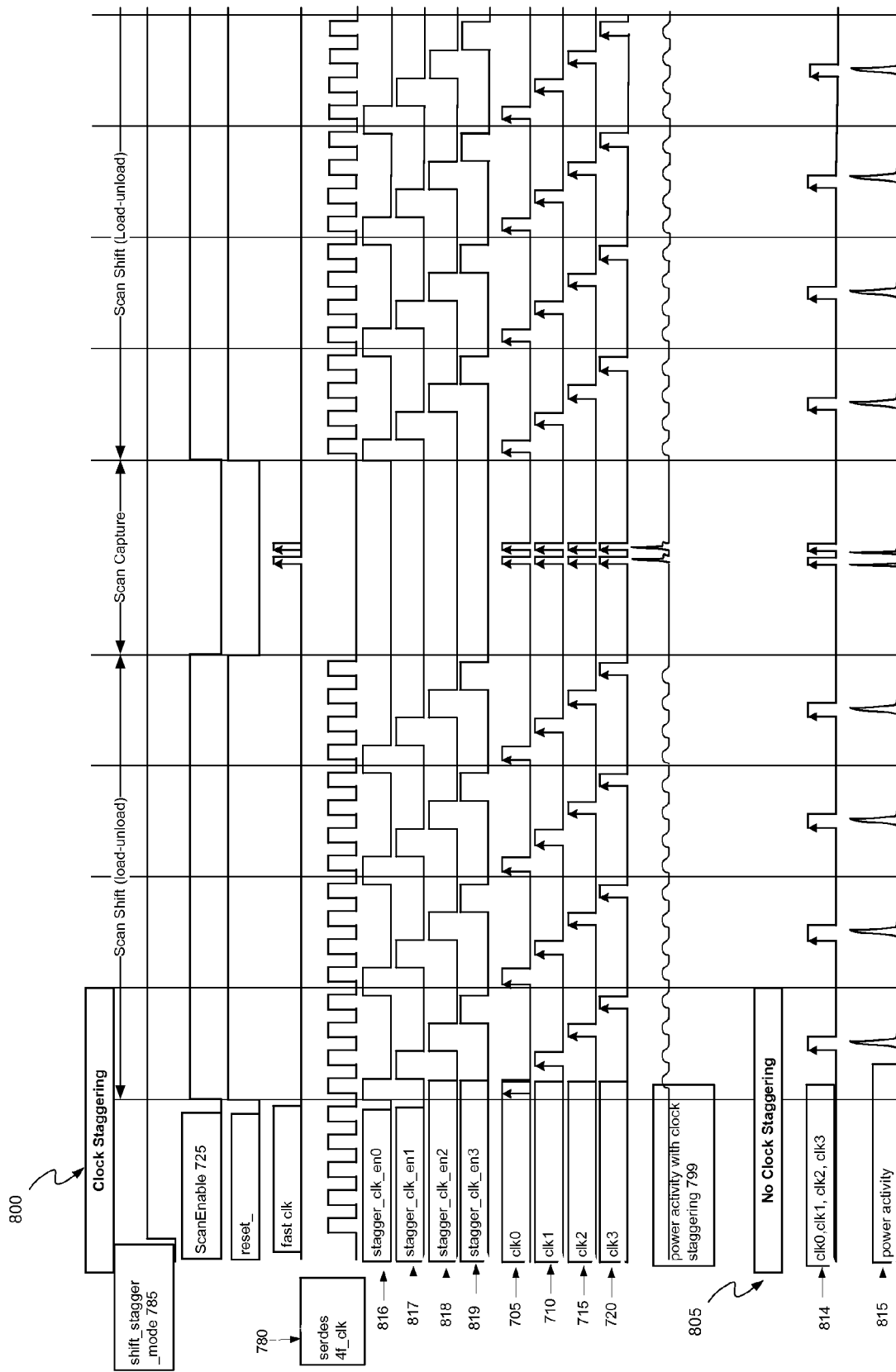
FIG. 8 illustrates a timing diagram for the exemplary circuit for controlling partition level shift clock staggering using clock stagger control logic illustrated in FIG. 7 in accordance with one embodiment of the present invention.

FIG. 8 illustrates a timing diagram, 800, for the exemplary circuit for controlling partition level shift clock staggering using clock stagger control logic illustrated in FIG. 7 in accordance with one embodiment of the present invention. In one embodiment, the present invention takes advantage of the SerDes scan architecture "4f" clocks to clock the external scan chains from chip I/O e.g. ScanIn0 509 in FIG. 5 to deserializer module 504 and from serializer module 503 to chip I/O e.g. ScanOut0 508. The relationship between the SerDes 4f clock, 780, in FIG. 8 and the internal scan chain clocks (clk0 705, clk1 710, clk2 715, clk3 720) is 4:1 as shown in the waveforms of FIG. 8. For every four clock pulses of the SerDes 4f clock 780, each of the internal scan chain test clocks will pulse once to allow the deserialized data to be loaded in the scan chains and the serialized data to shift out of the scan chains correctly. As shown in FIG. 7, each partition level scan test clock is gated using clock gating cells 750, with the SerDes 4f clock 780 being the input to these clock gating cells when ScanEnable 725 is enabled.

Figure 9:
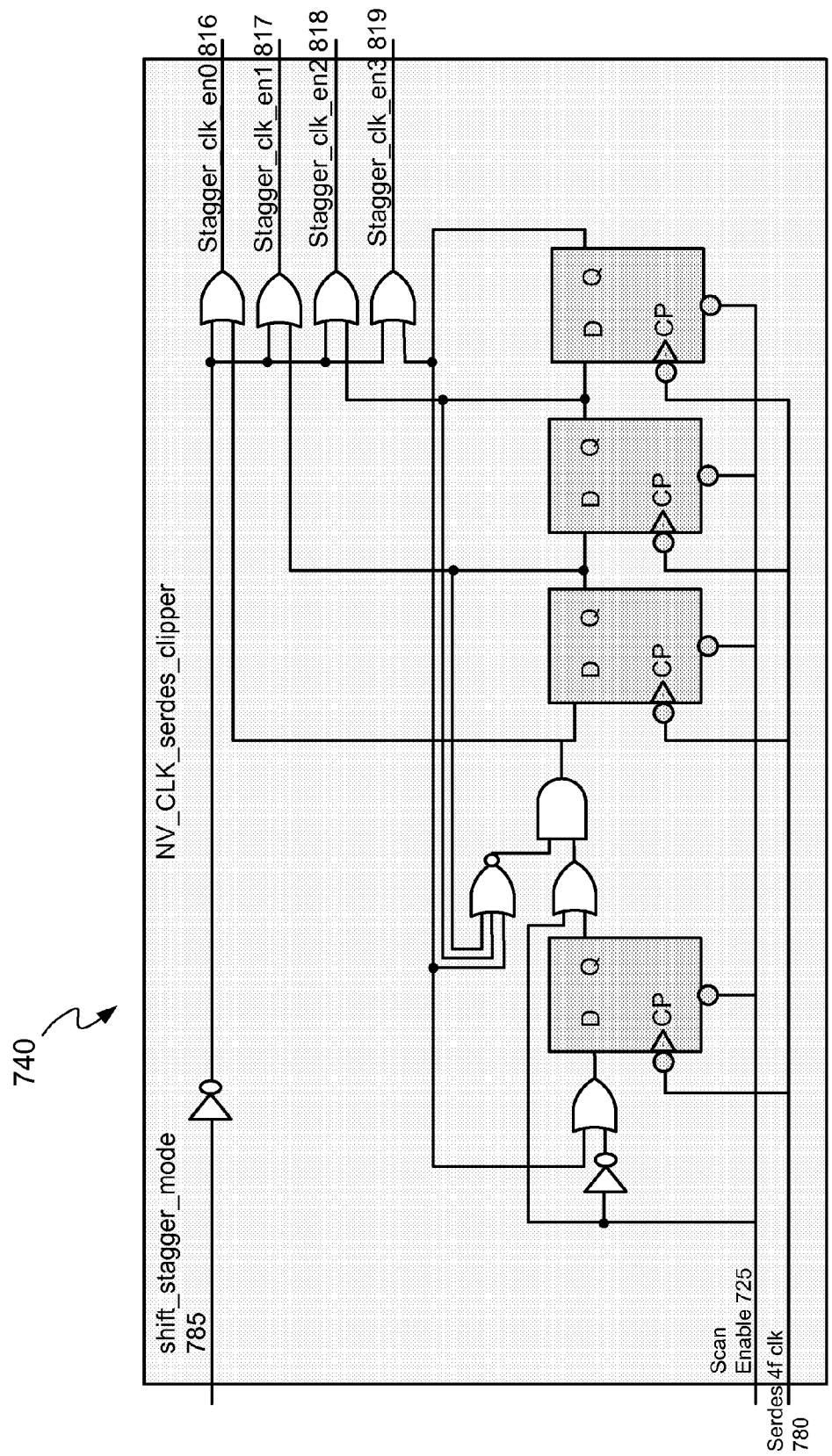
FIG. 9 is a schematic diagram illustrating the details of the exemplary stagger control logic for generating clock stagger enables for each partition scan clock in accordance with one embodiment of the present invention.

As also illustrated in FIG. 8, during scan shift, both the ScanEnable 725 and shift_stagger_mode 785 signals are enabled. In response, module 740 will generate four clock stagger enable signals for each partition clock. FIG. 9 is a schematic diagram illustrating the details of the exemplary stagger control logic module 740 from FIG. 7 for generating clock stagger enables for each partition scan clock in accordance with one embodiment of the present invention. The control logic in module 740 creates four stagger clock enable signals to be used to control the clock gating cells for each partition. As shown in FIG. 9, during scan shift mode, both ScanEnable 725 and shift_stagger_mode 785 control module 740. When the two signals are active, the circuitry of module 740 creates four clock stagger enable signals (Stagger_clk_en0 816, Stagger_clk_en1 817, Stagger_clk_en2 818, Stagger_clk_en3 819) for each partition clock. These clock stagger enable signals control the clock gating cells 750 in a way such that only one clock pulse for every four clock pulses of the SerDes 4f clock 780 is provided to the internal scan chains of each of the four partitions, Partition0-Partition3.

The waveforms for the clk0 705, clk1 710, clk2 715 and clk3 720 signals in FIG. 8 illustrate that each of the partition clocks pulses only once every 4 cycles of the SerDes 4f clock 780 and that they are staggered so that none of the four partitions are clocked together. Each of the stagger clock enable signals (Stagger_clk_en0 816, Stagger_clk_en1 817, Stagger_clk_en2 818, Stagger_clk_en3 819 as shown in FIG. 8) controls the clock gating cells for each of the four partitions, which in turn allows the scan chains in each partition to be shifted at different times within the period comprising 4 cycles of the SerDes 4f clock 780. The use of stagger clock enable signals in this fashion allows the partition clock pulses for each partition to be staggered without the use of any delay logic being introduced on the clock path.

In one embodiment, the SerDes architecture is scalable so that the SerDes modules can be more than 4 bits wide. Also, more than 4 scan test clocks can be generated using the high speed serial clock in the system and more than 4 partitions can be supported using the high speed serial clock.

As illustrated in FIG. 8, in this embodiment of the present invention, the clock staggering is only being used during scan shift. By comparison, during the capture cycle, the high speed capture clock is provided to the scan chains in all partitions for transition delay testing at the same time.

As a result of skewing the load-unload cycles of the scan chains in the different partitions by using the clock staggering mechanism of the present invention, peak power during scan shift is reduced as seen from the "power activity with clock staggering" waveform 799. This allows scan chains within the partitions to be shifted at higher speed which would not be possible without the clock staggering support. The ultimate effect of partition level clock staggering during scan shift is to reduce local IR drop by reducing the scan chain toggling within smaller and more localized regions of the chip.

For purposes of comparison, FIG. 8 also provides a waveform, 814, for the partition clocks without clock staggering, and a waveform, 815, for associated power activity. As shown, if all the partitions are clocked at the same time, the peak power magnitude in 815 is significantly higher than in waveform 799, where clock staggering is implemented.

In one embodiment of the present invention, further reduction in local IR drop is made possible by further staggering the scan shift clocks for one or more of the scan chains in each partition as long as there are a plurality of scan chain groups in each partition and staggering the shift clock for these chains will not affect the scan load-unload operation. Also staggering within the partition can only be implemented if one or more of the scan chains in the partition can be run using a separate scan test clock from the other scan chains in the partition.

Figure 10:
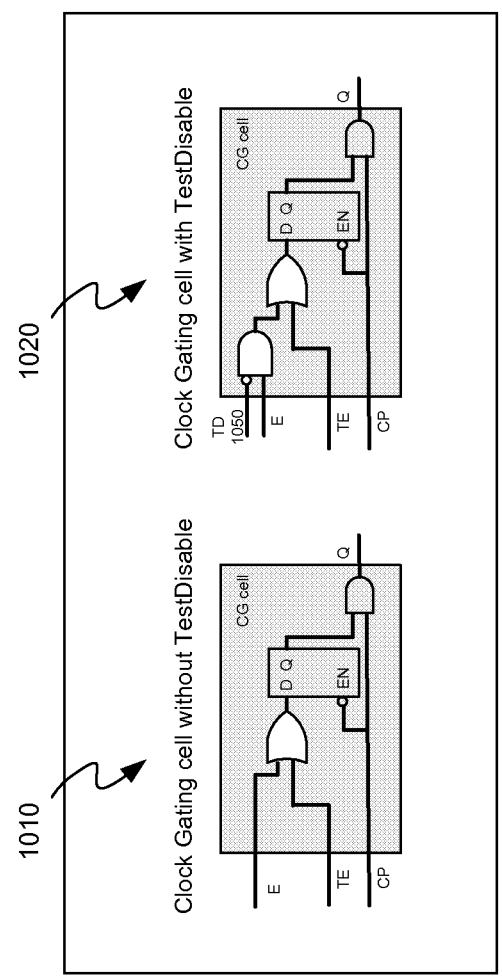
FIG. 10 is a schematic block diagram illustrating exemplary clock gating cells for each partition scan clock in accordance with one embodiment of the present invention.

FIG. 10 is a schematic block diagram illustrating exemplary clock gating cells for each partition scan clock in accordance with one embodiment of the present invention. Modules 1010 and 1020 are different embodiments of the clock gating module 750 illustrated in FIG. 7. Module 1020 implements the clock gating cell with a test disable mode activated through Test Disable signal 1050 that allows the cell to be disabled if ScanEnable 725 signal is low when connected to the system as shown in FIG. 7. Module 1010, on the other hand, does not comprise a test disable mode.

Figure 11:
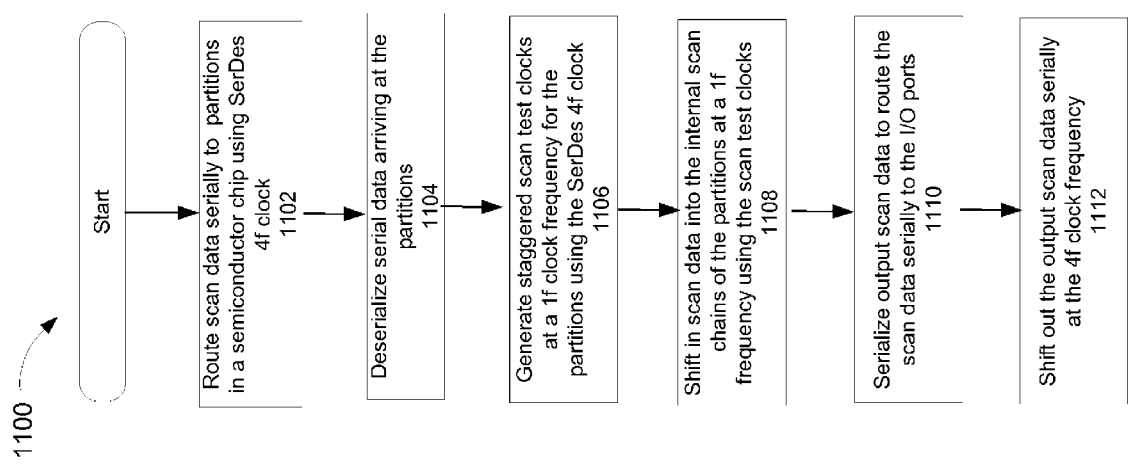
FIG. 11 depicts a flowchart of an exemplary process of mitigating peak power issues during the scan shift cycle at the local level for a scan based test in accordance with one embodiment of the present invention.

FIG. 11 depicts a flowchart 1100 of an exemplary process of shift clock staggering to mitigate shift peak power issues according to an embodiment of the present invention. The invention, however, is not limited to the description provided by flowchart 1100. Rather, it will be apparent to persons skilled in the relevant art(s) from the teachings provided herein that other functional flows are within the scope and spirit of the present invention. Flowchart 1100 will be described with continued reference to exemplary embodiments described above, though the method is not limited to those embodiments.

At block 1102, scan data is routed by the tester processor 114 of the tester computing system 110 from a plurality of I/O ports, e.g., ScanIn0 509, to the partitions, e.g., Partition0 502, in the integrated circuit being tested using the SerDes 4f clock. SerDes 4f clock can operate at high frequencies, at or above 250 MHz.

At step 1104, deserializer modules, e.g., 504, deserialize serial data arriving at the partitions to prepare the scan data to be fed into the scan chains internal to the partitions.

At step 1106, the gating cells 750 generates the scan test clocks used to pulse the scan data into each respective partition. Each scan test clock operates at a 1f clock frequency and pulses in a way such that no more than one of the scan test clocks pulse at any given time. The waveforms for the scan test clock signals, clk0 705, clk1 710, clk2 715 and clk3 720, in FIG. 8 illustrate that each of the partition clocks pulses only once every 4 cycles of the SerDes 4f clock 780, i.e., it operates at a 1f clock frequency. It also illustrates that the scan test clocks are staggered so that none of the four partitions are clocked together.

The gating cells 750 are controlled by the logic in the stagger control module 740 that generates enable signals to control the gating cells in a way such that only one clock pulse for every four clock pulses of the SerDes 4f clock 780 is provided to the internal scan chains of each of the four partitions, Partition0-Partition3.

At step 1108, the scan data is shifted in by the deserializer modules into the internal scan chains of the partitions at the 1f clock frequency using the scan test clocks.

At step 1110, the scan data output is serialized by the serializer modules, e.g., module 503, to prepare the data to be shifted out of the respective partitions and routed back to the I/O ports. Finally at step 1112, the scan data output is shifted out serially at the SerDes 4f clock frequency.

Staggering the scan shift clocks for the partitions using a SerDes scan architecture using the method describe above can help reduce scan shift peak power issues at the local level by preventing simultaneous switching of all the flops in the scan chain in a localized area of the chip. Depending on how many scan chain groups there are in the design and how many scan chain groups are enabled at any given time, there can be a significant improvement in peak shift power. For example, if there are two scan chain groups, and one group is enabled at a time, there is approximately a 50% reduction in peak shift power.

System for Reducing Peak Power During Scan Shift at the Global Level for Scan Based Tests Embodiments of the present invention also provide a method and system for reducing peak power problems during scan shift mode at the global level. According to a different embodiment of the present invention, peak power at the global level is reduced during the scan shift cycle by staggering the test clock to the CPU Cores and L2C cache, thereby, reducing the global voltage drop from the power rails. This allows the scan shift operations to be run at higher clock speeds, which in turn eventually reduces the overall test time during a production test.

Figure 12:
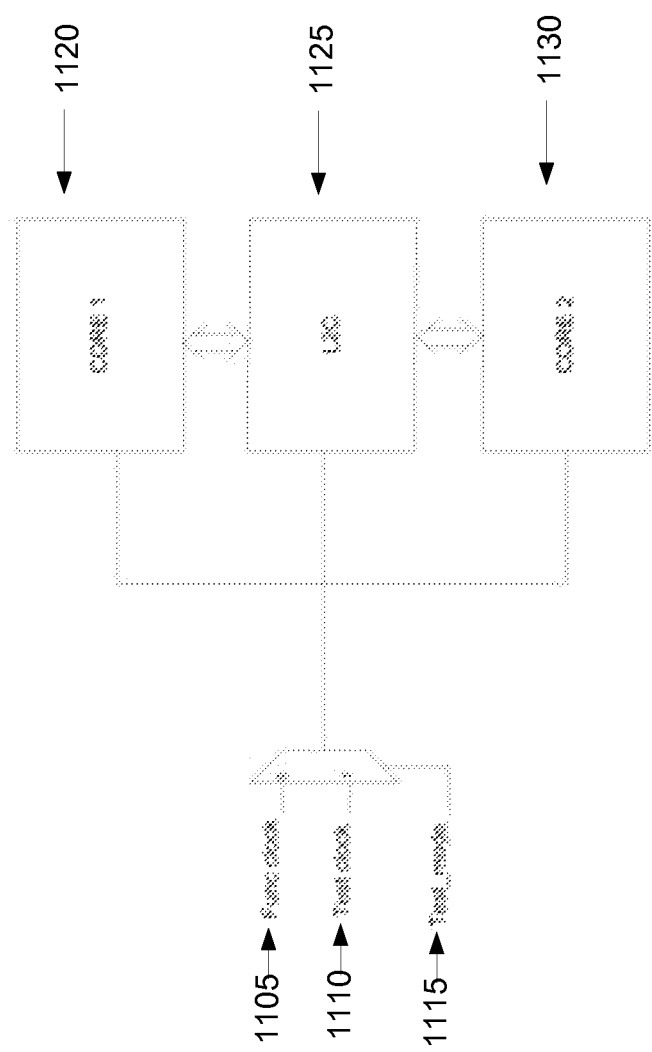
FIG. 12 is a schematic block diagram illustrating an exemplary circuit for multiplexing a test clock with a functional clock in a processing system in accordance with one embodiment of the present invention.

FIG. 12 is a schematic block diagram illustrating an exemplary circuit for multiplexing a test clock with a functional clock in a processing system, e.g., a CPU or GPU chip being tested using a scan test methodology, in accordance with one embodiment of the present invention. As shown in FIG. 12, test clock 1110 is multiplexed with functional clock 1105 at the root of the clock tree for easier timing closure and to conserve routing resources. Both test clock 1110 and functional clock 1105 can be driven externally through I/O pins coupled to the tester processor 114 in system 110. In one embodiment, functional clock 1105 can also be driven by a phase locked loop (PLL) or by a ring oscillator circuit that is internal to the chip. Signal Test_mode 1115 is used to select between the functional clock and the test clock. The selected clock is then routed to the three cores in the system, Core1 1120, Core2 1130 and L2C 1125.

Functional clocks in high performance CPUs or GPUs have very tight clock skew requirements, usually in tens of pico seconds. While tight skew requirements have positive impact on the functional performance of the CPU complex they have negative impact from a peak test power perspective as clock edges reach all the flops in the CPU complex at approximately the same time. As the number of transitions on a given clock edge during scan shift could be much higher than during normal operation, peak power during shift could be higher than the normal operation for which the part was designed. This could cause thermal hotspots and reliability problems for the part along with test failures causing manufacturing yield loss.

According to one embodiment of the present invention, peak power at the global level is reduced during the scan shift cycle by staggering the test clock edges that reach the CPU Cores and L2C cache. By separating test clock edges across different cores and L2 cache in the CPU complex, global IR drop is reduced. This method of reducing peak power issues at the global level can be used in conjunction with the previously discussed method of reducing peak power issues at the local level. It can also be used by itself if the prior method is found too intrusive or would not work for any other reason.

Figure 13:
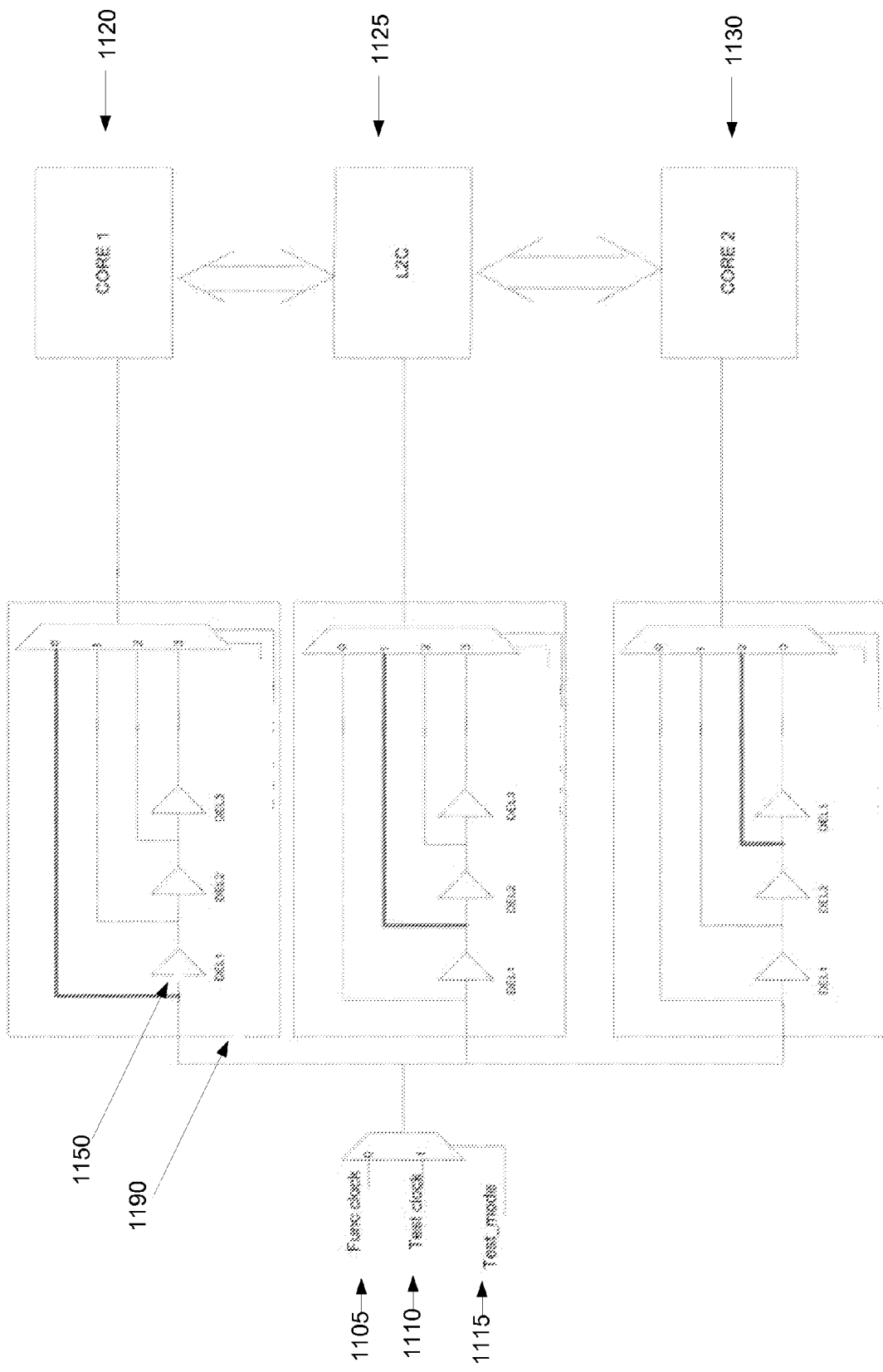
FIG. 13 is a schematic block diagram illustrating an exemplary circuit for staggering the shift clock to the processing cores and L2C cache in a processing system in accordance with one embodiment of the present invention.

FIG. 13 is a schematic block diagram illustrating an exemplary circuit for staggering the shift clock to the processing cores and L2C cache in the system in accordance with one embodiment of the present invention. As shown in FIG. 13, combinational delay elements, e.g., delay buffer 1150, of different delay values are added after the test clocks are multiplexed in with functional clocks to intentionally skew the clock across different cores and L2 cache. The amount of delay could be determined based on prior silicon data or could be a programmable delay value which could be set at the time of silicon bring-up.

As shown in FIG. 13, both Core1 1120 and Core2 1130 have paths to and from the L2C, which need to be tested. In this case, because there are paths between the different cores and L2C that need to be tested, test clock 1110 should not be skewed during the capture cycle to enable testing of these paths and to capture the correct functional outputs of the paths. Further, if scan chains are shared across the different cores and the L2C, then there needs to be enough hold margin for shift paths between the core and L2C to take delay in clock lines due to stagger into consideration.

FIG. 13 illustrates how the test clock to the cores and L2C can be staggered using clock trimmer blocks e.g., module 1190. The delay values for the delay buffers such as buffer 1150 can be controlled by JTAG bits, which can be programmed as part of the initial set up procedure. Initial values for these JTAG bits would come from timing/power analysis and can be characterized on the automated test equipment (ATE) for optimal values.

Figure 14:
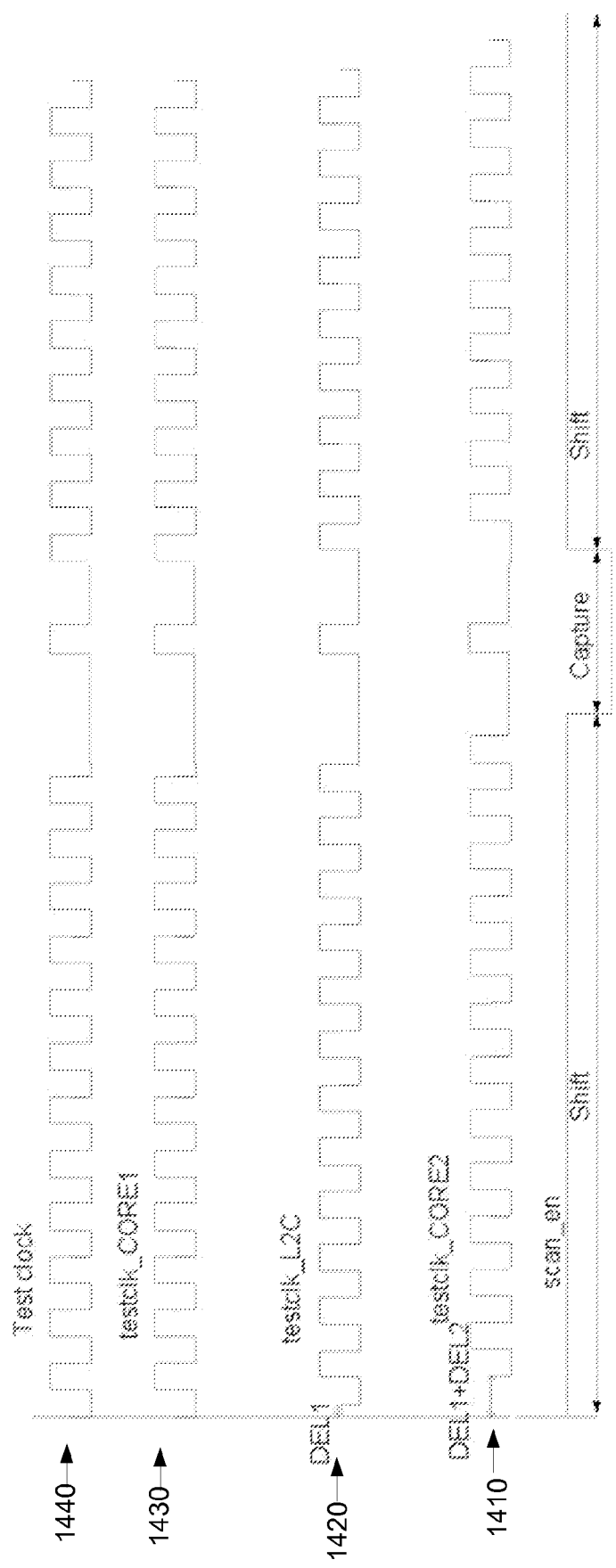
FIG. 14 is a timing diagram for the exemplary circuit for controlling shift clock staggering illustrated in FIG. 13 in accordance with one embodiment of the present invention.

FIG. 14 is a timing diagram for the exemplary circuit for controlling shift clock staggering illustrated in FIG. 13 in accordance with one embodiment of the present invention. Waveform 1440 illustrates the original test clock. Waveform 1430 is the clock signal provided to Core1 1120. Waveform 1420 is the clock signal provided to L2C 1125. Waveform 1410 is the clock signal provided to Core2 1130. As shown in FIG. 14, Core1 1120 will get a non-delayed test clock during the shift cycle. L2C 1125 will receive a test clock that is delayed by DEL1. Meanwhile Core2 1130 will receive a test clock that is delayed by DEL1+DEL2. These clocks are staggered only during the shift cycle but not during the capture cycle.

Figure 15:
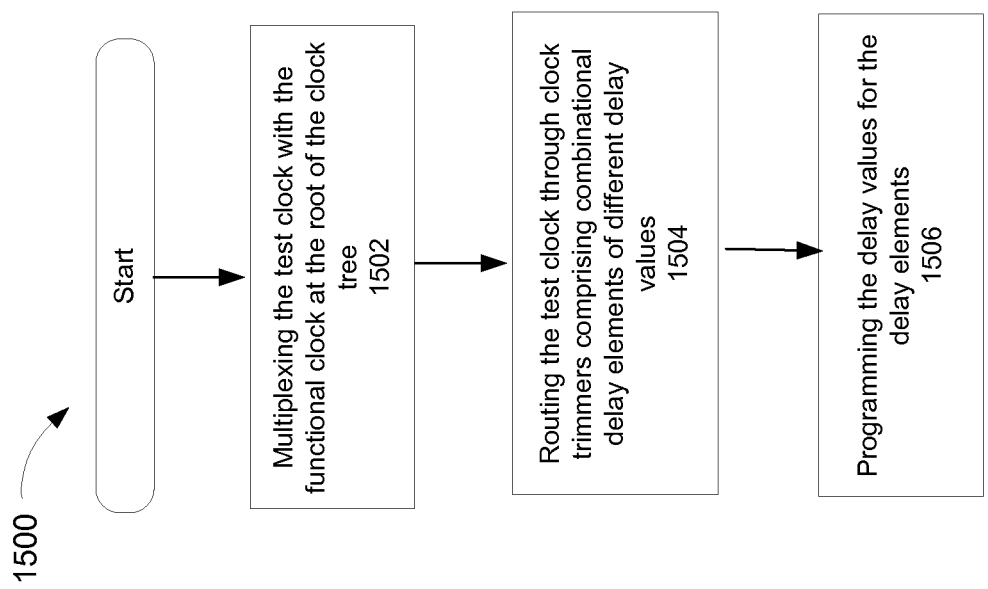
FIG. 15 depicts a flowchart of an exemplary process of mitigating peak power issues during the scan shift cycle at the global level for a scan based test in accordance with one embodiment of the present invention.

FIG. 15 depicts a flowchart 1500 of an exemplary process of mitigating peak power issues during the scan shift cycle at the global level for a scan based test according to an embodiment of the present invention. The invention, however, is not limited to the description provided by flowchart 1500. Rather, it will be apparent to persons skilled in the relevant art(s) from the teachings provided herein that other functional flows are within the scope and spirit of the present invention. Flowchart 1100 will be described with continued reference to exemplary embodiments described above, though the method is not limited to those embodiments.

At step 1502, the test clock is multiplexed with the functional clock at the root of the clock tree as discussed above.

At step 1504, the test clock is routed through clock trimmer blocks, e.g., module 1190, comprising combinational delay elements of varying delay values. These delays are inserted into the design after the test clock is multiplexed in with the functional clock but before the test clock reaches the CPU cores or L2C.

Finally, at step 1506, the value of the delay elements can be programmed using JTAG bits as discussed above.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered as examples because many other architectures can be implemented to achieve the same functionality.

The process parameters and sequence of steps described and/or illustrated herein are given by way of example only. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

While various embodiments have been described and/or illustrated herein in the context of fully functional computing systems, one or more of these example embodiments may be distributed as a program product in a variety of forms, regardless of the particular type of computer-readable media used to actually carry out the distribution. The embodiments disclosed herein may also be implemented using software modules that perform certain tasks. These software modules may include script, batch, or other executable files that may be stored on a computer-readable storage medium or in a computing system. These software modules may configure a computing system to perform one or more of the example embodiments disclosed herein. One or more of the software modules disclosed herein may be implemented in a cloud computing environment. Cloud computing environments may provide various services and applications via the Internet. These cloud-based services (e.g., software as a service, platform as a service, infrastructure as a service, etc.) may be accessible through a Web browser or other remote interface. Various functions described herein may be provided through a remote desktop environment or any other cloud-based computing environment.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

Embodiments according to the invention are thus described. While the present disclosure has been described in particular embodiments, it should be appreciated that the invention should not be construed as limited by such embodiments, but rather construed according to the below claims.

What is claimed is:

1. A method for testing an integrated circuit, said method comprising:
    multiplexing a test clock with a functional clock on said integrated circuit at a root of a clock tree to produce a second clock signal;
    dividing the second clock signal into multiple branches, wherein each branch is operable to be delayed by a plurality of delay elements, and wherein each branch is delayed by a different number of delay elements of the plurality of delay elements to produce a plurality of lines with variable delay;
    routing each line of said plurality of lines with variable delay to a respective plurality of cores and a cache on said integrated circuit, wherein each of the plurality of cores and the cache is operable to be subdivided into a plurality of partitions; and
    staggering a third clock signal received by each of the plurality of cores and the cache during a scan shift cycle, wherein the third clock signal is derived from the second clock signal and routed using a respective line of said plurality of lines.

2. The method of claim 1 wherein each of the plurality of cores and the cache receives an active edge of the third clock signal at a separate time.

3. The method of claim 1 further comprising programming a value of the plurality of delay elements.

4. The method of claim 1 wherein said integrated circuit is selected from the group comprising: a graphics processor and a central processor.

5. The method of claim 1 wherein the clock signal is staggered between each of the plurality of cores and the cache by a constant value.

6. The method of claim 1 further comprising staggering scan test clock pulses transmitted to the plurality of partitions, so that each partition in the plurality of partitions shifts scan data in or out of the partition at a different time from its neighboring partitions.

7. A method for testing an integrated circuit, said method comprising:
    multiplexing a test clock with a functional clock on said integrated circuit at a root of a clock tree to produce a second clock signal;
    dividing the second clock signal into multiple branches, wherein each branch is operable to be delayed by a plurality of delay elements, and wherein each branch is delayed by a different number of delay elements of the plurality of delay elements;
    routing each branch to a respective plurality of cores and a cache on said integrated circuit, wherein each of the plurality of cores and the cache is operable to be subdivided into a plurality of partitions; and
    staggering a third clock signal received by each of the plurality of cores and the cache during a scan shift cycle, wherein each of the plurality of cores and the cache receives an active edge of the second clock signal at a separate time, wherein the third clock signal is derived from the second clock signal and routed using a respective branch of the multiple branches.

8. The method of claim 7 further comprising programming a value of the plurality of delay elements.

9. The method of claim 7 wherein said integrated circuit is selected from the group comprising: a graphics processor and a central processor.

10. The method of claim 7 wherein the third clock signal is staggered between each of the plurality of cores and the cache by a constant value.

11. The method of claim 7 further comprising staggering scan test clock pulses transmitted to the plurality of partitions, so that each partition in the plurality of partitions shifts scan data in or out of the partition at a different time from its neighboring partitions.

12. A system for testing an integrated circuit, said system comprising:
    a computer system comprising a tester processor, wherein said tester processor is communicatively coupled to a integrated circuit, wherein said integrated circuit comprises:
    a plurality of I/O ports, wherein at least one I/O port is associated with a test clock signal driven by said tester processor;
    a multiplexer operable to multiplex the test clock signal with a functional clock signal at a root of a clock tree;
    a plurality of cores and a cache, wherein each of the plurality of cores and the cache is operable to be subdivided into a plurality of partitions, wherein each partition employs a SerDes scan architecture; and
    a clock trimmer module comprising a plurality of delay elements operable to add delay to a clock path signal, wherein said clock path signal is an output of said multiplexer and wherein the plurality of delay elements are operable to stagger a respective test clock received by each of the plurality of cores and the cache via the clock path signal.

13. The system of claim 12 wherein each of the plurality of cores and the cache receives an active edge of the respective test clock at a separate time.

14. The system of claim 12 wherein said integrated circuit further comprises JTAG bits operable to program the plurality of delay elements.

15. The system of claim 12 wherein said integrated circuit is selected from the group comprising: a graphics processor and a central processor.

16. The system of claim 12 wherein the clock path signal is staggered between each of the plurality of cores and the cache by a constant value.

* * * * *